(12) United States Patent
Kim et al.

(10) Patent No.: US 8,525,406 B2
(45) Date of Patent: Sep. 3, 2013

(54) ORGANIC LIGHT EMITTING DIODE DISPLAY

(75) Inventors: Eun-Ah Kim, Yongin (KR); Chul-Woo Jeong, Yongin (KR); Joo-Hwa Lee, Yongin (KR); Hee-Seong Jeong, Yongin (KR); Noh-Min Kwak, Yongin (KR); Soon-Ryong Park, Yongin (KR); Hee-Chul Jeon, Yongin (KR); Woo-Suk Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 783 days.

(21) Appl. No.: 12/654,119

(22) Filed: Dec. 10, 2009

(65) Prior Publication Data

US 2010/0149078 A1 Jun. 17, 2010

(30) Foreign Application Priority Data

Dec. 11, 2008 (KR) .................. 10-2008-0126038

(51) Int. Cl.
*H01L 51/52* (2006.01)

(52) U.S. Cl.
USPC .......................................... 313/512; 313/504

(58) Field of Classification Search
USPC .............. 257/40, 72, 98–100, 642–643, 759; 313/498–512; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS

| 2004/0051452 | A1* | 3/2004 | Tamashiro et al. | ........... 313/512 |
| 2008/0309235 | A1* | 12/2008 | Yamazaki et al. | ........... 313/512 |

FOREIGN PATENT DOCUMENTS

| JP | 2007-242591 A | 9/2007 |
| JP | 2007-258145 A | 10/2007 |
| KR | 10 2007-0078240 A | 7/2007 |
| KR | 10-0795818 B1 | 1/2008 |
| KR | 10-0838079 B1 | 6/2008 |

* cited by examiner

*Primary Examiner* — Donald Raleigh
(74) *Attorney, Agent, or Firm* — Lee & Morse, P.C.

(57) ABSTRACT

An OLED display includes a first substrate including a thin film transistor and an organic light emitting element and a second substrate facing the first substrate and having a gully pattern recessed on a surface facing the first substrate. By having the gully pattern on the second substrate, a mechanical strength of the OLED may be improved, and thus, the OLED may minimize the thickness without reducing the mechanical strength.

14 Claims, 7 Drawing Sheets

ORGANIC LIGHT EMITTING DIODE DISPLAY

BACKGROUND OF THE INVENTION

1. Field of the Invention

Embodiments relate to an organic light emitting diode (OLED) display. More particularly, the embodiments relate to an OLED display that has improved mechanical strength and reduced thickness.

2. Description of the Related Art

OLED displays do not need a separate light source due to self-emission characteristics that OLED displays possess. Therefore, the thickness and weight of OLED displays can be reduced compared to other display types, e.g., liquid crystal displays (LCD). Further, because OLED displays have characteristics that ensure high-quality, e.g., low power consumption, high luminance, and high response speed, OLED displays have been attracting attention as the next generation displays for portable electronic devices.

In general, an OLED display includes two bonded substrates. Each substrate includes a base substrate member made of a material, e.g., glass. Because the base substrate member should be sufficiently thick to provide sufficient mechanical strength, minimizing the thickness of an OLED display is limited. If an OLED display decreases the thickness by using a thin base substrate member, the OLED display may also decrease the mechanical strength thereof.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments are therefore directed to an OLED display, which substantially overcome one or more of the disadvantages of the related art.

It is therefore a feature of an embodiment to provide an OLED display that is capable of reducing thickness as well as improving mechanical strength.

It is therefore another feature of an embodiment to provide an OLED display where the luminance and life-span are increased.

At least one of the above features and other advantages may be realized by providing an OLED display including a first substrate including a thin film transistor and an organic light emitting element, and a second substrate disposed to face the first substrate and having a gully pattern recessed on a surface facing the first substrate.

The gully pattern may have a stripe shape.

The gully pattern may have a lattice shape.

The organic light emitting element is divided into a light emitting region and a non-light emitting region, and the gully pattern may correspond to the non-light emitting region of the organic light emitting element.

The organic light emitting element includes a first electrode, an organic emission layer, a second electrode, and a pixel defining film, the pixel defining film has an opening that exposes the first electrode of the organic light emitting element and further defines the light emitting region and the non-light emitting region of the organic light emitting element, and the gully pattern may be formed at a position substantially corresponding to the non-opening portions of the pixel defining film of the first substrate.

The non-emitting region of the organic light emitting element may be the region where only the second electrode is formed.

The non-emitting region of the organic light emitting element may be the region where the organic emissive layer does not emit light.

The gully pattern may have a width of several micrometers (μm).

The second substrate in the organic light emitting diode display may further include a light shield layer filling the gully pattern.

The light shield layer may be an inkjet-printed layer.

The light shield layer may have a width of several micrometers (μm).

The light shield layer may be formed on a part of the second substrate corresponding to a non-light emitting region of the organic light emitting element.

The light shield layer may be formed of an opaque material, an absorbing material, or a filtering material.

The light shield layer may completely fill the gully pattern.

The organic light emitting element is divided into a light emitting region and a non-light emitting region, and the gully pattern may correspond to the non-light emitting region of the organic light emitting element.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Korean Patent Application No. 10-2008-0126038, filed on Dec. 11, 2008, in the Korean Intellectual Property Office and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Further, in the following exemplary embodiments, constituent elements having the same configuration are designated by the same reference numerals and are representatively described in a first exemplary embodiment, and only configurations that are different from the first embodiment are described in other exemplary embodiments.

Hereinafter, a first exemplary embodiment is described with references to FIG. 1 through FIG. 3.

Figure 1:
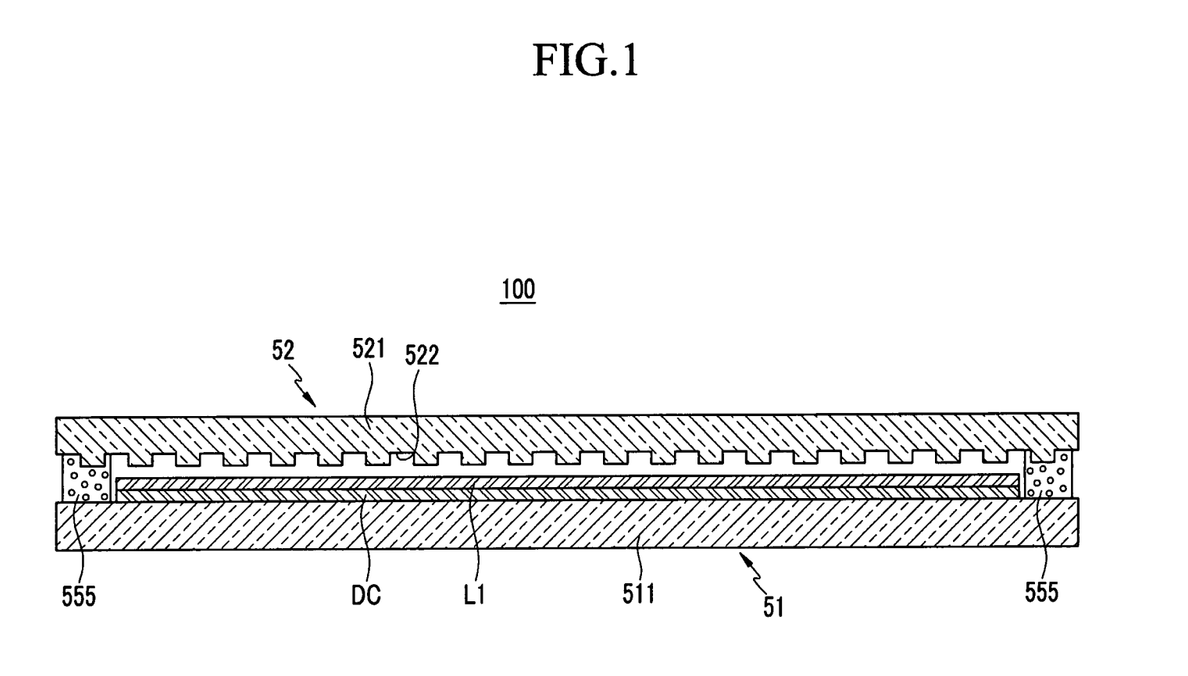
FIG. 1 illustrates a cross-sectional view of an OLED display according to a first exemplary embodiment.
Figure 2:
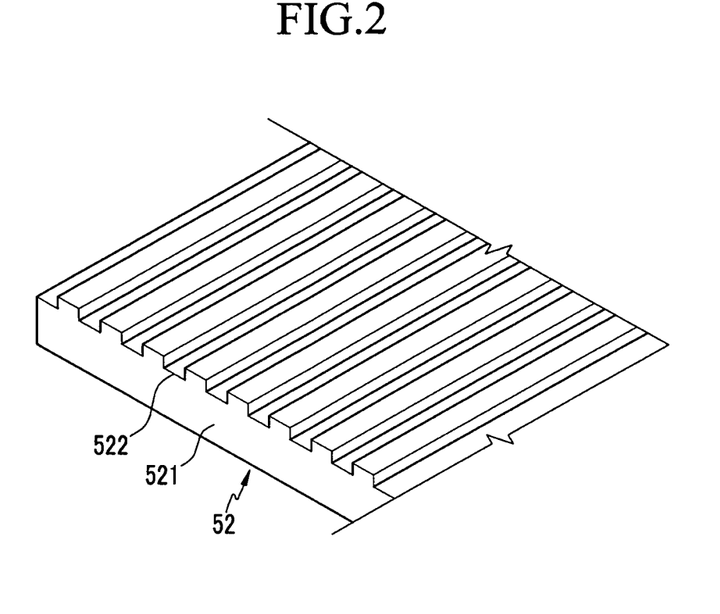
FIG. 2 illustrates a partial perspective view showing a second substrate used in the OLED display of FIG. 1.

As illustrated in FIG. 1, an OLED display 100 may include a first substrate 51, a second substrate 52, and a sealant 555.

The first substrate 51 may include a first substrate member 511, driving circuits (DC) sequentially formed on the first substrate member 511, and an organic light emitting element L1.

The second substrate 52 may be disposed to face the first substrate 51 such that it covers the driving circuits (DC) and the organic light emitting element L1 of the first substrate 51. The driving circuits (DC) and the organic light emitting element L1 may be in between the first substrate 51 and the second substrate 52 with the sealant 555 sealing the driving circuits (DC) and the organic light emitting element L1 between the two substrates. Further, the second substrate 52 may include a second substrate member 521 and a gully pattern 522 recessed on one side of the second substrate member 521, e.g., a side facing the first substrate 51. In the OLED display 100 according to the first exemplary embodiment, the gully pattern 522, as illustrated in FIG. 2, may be formed in a stripe. That is, the gully pattern 522 may include a plurality of grooves formed as long and narrow stripes. In this configuration, the gully pattern 522 may have a width of several micrometers (μm), in accordance with spacing between pixels. The gully pattern 522 may be formed on a part of the second substrate 52 corresponding to a non-light emitting region (NEA) of the organic light emitting element L1, e.g., the grooves may be between individual pixels. Details thereof will be discussed subsequently in reference to FIG. 4.

The sealant 555 may be disposed along the edges of the first substrate 51 and the second substrate 52 to bond and seal the first and the second substrates 51 and 52 together.

Hereinafter, the structure of the OLED display 100 according to the first exemplary embodiment is described with references to FIG. 3 and FIG. 4.

Figure 3:
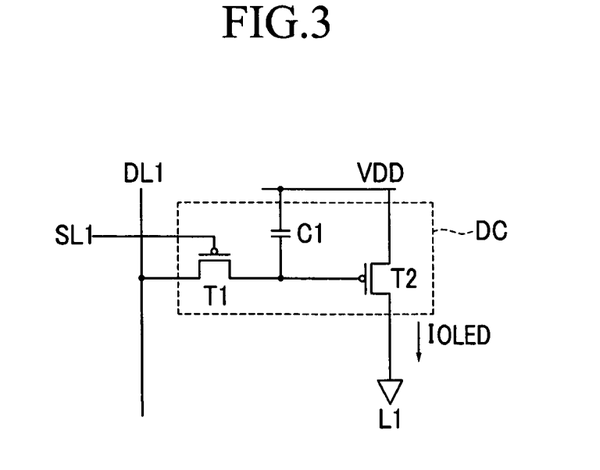
FIG. 3 illustrates a circuit layout view of one pixel included in the OLED display of FIG. 1.

FIG. 3 illustrates a circuit layout view of one pixel of the OLED display 100. The pixel is a minimum unit for displaying an image. FIG. 4 illustrates a cross-sectional view of one pixel of the OLED display.

As illustrated in FIG. 3, the driving circuit (DC) may include two thin film transistors T1 and T2 and one storage capacitor C1 for each pixel. The two thin film transistors may basically include a switching transistor T1 and a driving transistor T2.

The switching transistor T1 may be connected to a scan line SL1 and a data line DL1, and may transmit a data voltage, which is input through the data line DL1 according to a switching voltage input to the scan line SL1, to the driving transistor T2. A storage capacitor C1 may be connected to the switching transistor T1 and a power line VDD. The storage capacitor C1 may store a voltage corresponding to a difference between a voltage transmitted from the switching transistor T1 and a voltage supplied to the power line VDD.

The driving transistor T2 may be connected to the line VDD and the storage capacitor C1. The driving transistor T2 may supply an output current (IOLED), which is proportional to a square of the difference between the voltage stored in the storage capacitor C1 and a threshold voltage, to the organic light emitting element L1. The organic light emitting element L1 may emit light in accordance with the output current (IOLED).

However, the circuit arrangement of one pixel in the OLED display 100 according to the first exemplary embodiment may not be necessarily limited to the configuration described above. Therefore, the driving circuit (DC) may include, e.g., three or more thin film transistors and two or more storage capacitors for each pixel.

Figure 4:
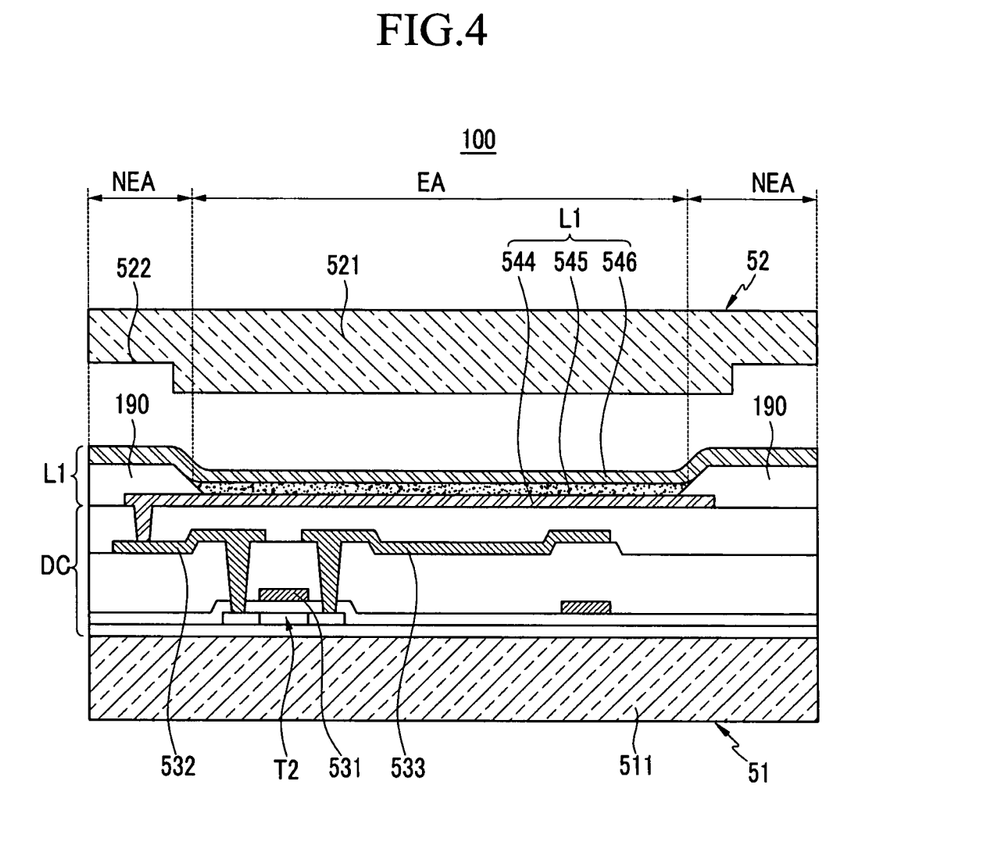
FIG. 4 illustrates a partial enlarged cross-sectional view of the OLED display of FIG. 1.

Further, as illustrated in FIG. 4, the driving transistor T2 may include a source electrode 533, a drain electrode 532, and a gate electrode 531.

The organic light emitting element L1 may include a first electrode 544, an organic emission layer 545 formed on the first electrode 544, and a second electrode 546 formed on the organic emission layer 545. Some portions of the second electrode 546 may be formed on a pixel defining film 190. The first electrode 544 of the organic light emitting element L1 may be connected to the drain electrode 532 of the driving transistor T2. In general, the first electrode 544 may function as an anode and the second electrode 546 may function as a cathode. However, the configuration of the organic light emitting element L1 is not limited thereto and may be variously modified in known configurations that are easily achieved by those skilled in the art.

Further, the organic light emitting element L1 may be divided into a light emitting region (EA) and the non-light emitting region (NEA). The light emitting region (EA) may be a region where the organic emission layer 545 emits light between the first electrode 544 and the second electrode 546. The non-light emitting region (NEA) may be a region where only the second electrode 546 is formed or the organic emission layer 545 does not emit light.

The OLED display 100 may further include the pixel defining film 190. The pixel defining film 190 may have an opening that exposes the first electrode 544 and defines the light emitting region (EA) and the non-light emitting region (NEA). The organic emission layer 545 and the second electrode 546 may be sequentially arranged in the opening of the pixel defining film 190 so that the organic emission layer 545 may be in contact with the exposed portion of the first electrode 544, and thus, may emit light. The organic emissive layer 545 may not completely fill the opening of the pixel defining film 190. For example, the organic emissive layer 545 may not completely fill the sides of the opening, and thus, some portions of the sides of the openings are only in contact with the second electrode 546. That is, the substantial non-opening portion of the pixel defining film 190 may become the non-light emitting region (NEA) and the substantial opening of the pixel defining film 190 may become the light emitting region (EA). The entire opening of the pixel defining film 190 may not define the light emitting region (EA), as illustrated in FIG. 4.

The gully pattern 522 may fill most of the non-light emitting region (NEA). The gully pattern 522 may be substantially complementary to the opening of the pixel defining film 190. In other words, the opening in the pixel defining film 190 may not correspond to the grooves of the gully pattern 522 along an axis extending between the first substrate 51 and the second substrate 52.

By this configuration, the OLED display 100 may have improved mechanical strength and a slim thickness. That is, the mechanical strength of the OLED may be improved by the second substrate 52 having the gully pattern 522. Therefore, it may be possible to impart an appropriate strength to the second substrate 52 while minimizing the thickness. Therefore, the OLED display 100 including the second substrate 52 having the gully pattern 522 according to the first exemplary embodiment may have improved mechanical strength while being significantly reduced in thickness.

Figure 5:
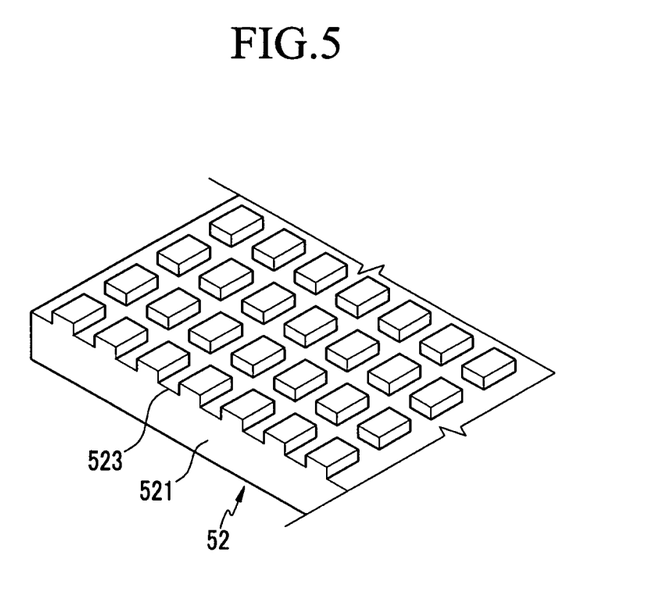
FIG. 5 illustrates a perspective view of a second substrate according to a modification of the first exemplary embodiment.

FIG. 5 illustrates a gully pattern 523 of the second substrate 52 according to a modification of the first exemplary embodiment. As illustrated in FIG. 5, in the modification of the first exemplary embodiment, the gully pattern 523 of the second substrate 52 may be formed in a lattice shape. That is, the gully pattern 523 may include a plurality of long and narrow grooves crossing each other in a lattice shape. For example, the gully pattern 523 may be segmented into rectangular pieces. The gully pattern 523 may be formed on a part of the second substrate 52 corresponding to the non-light emitting region (NEA) of the organic light emitting element L1 of the first substrate 51. The gully pattern 523 formed in the lattice shape as described above may also improve the mechanical strength of the second substrate 52.

Hereinafter, a second exemplary embodiment is described with reference to FIG. 6 and FIG. 7.

Figure 6:
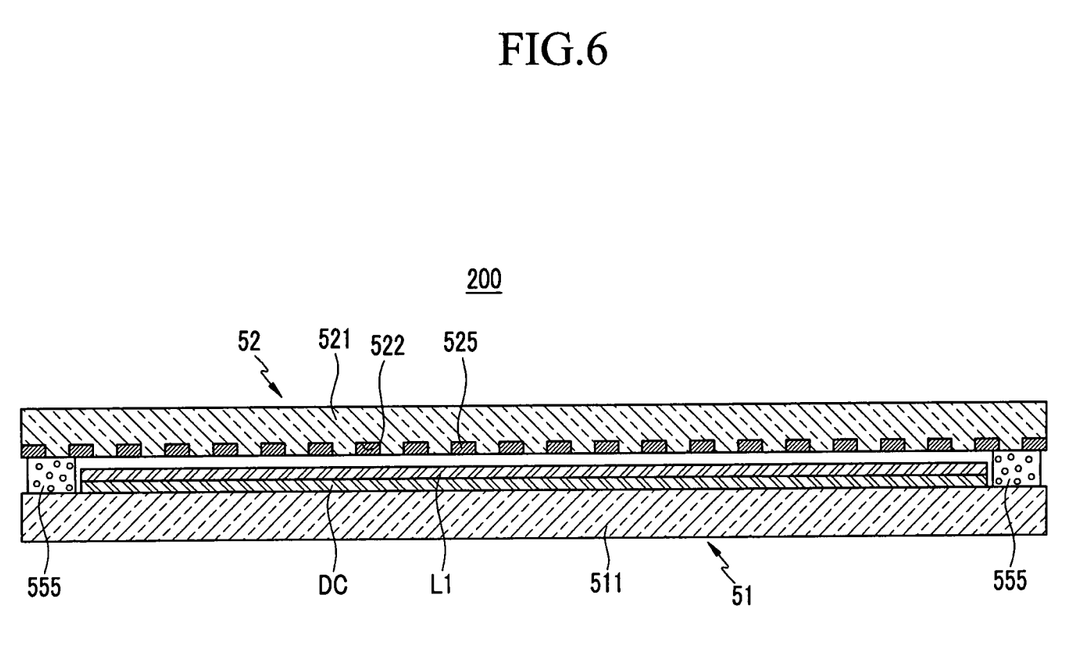
FIG. 6 illustrates a cross-sectional view of an OLED display according to a second exemplary embodiment.
Figure 7:
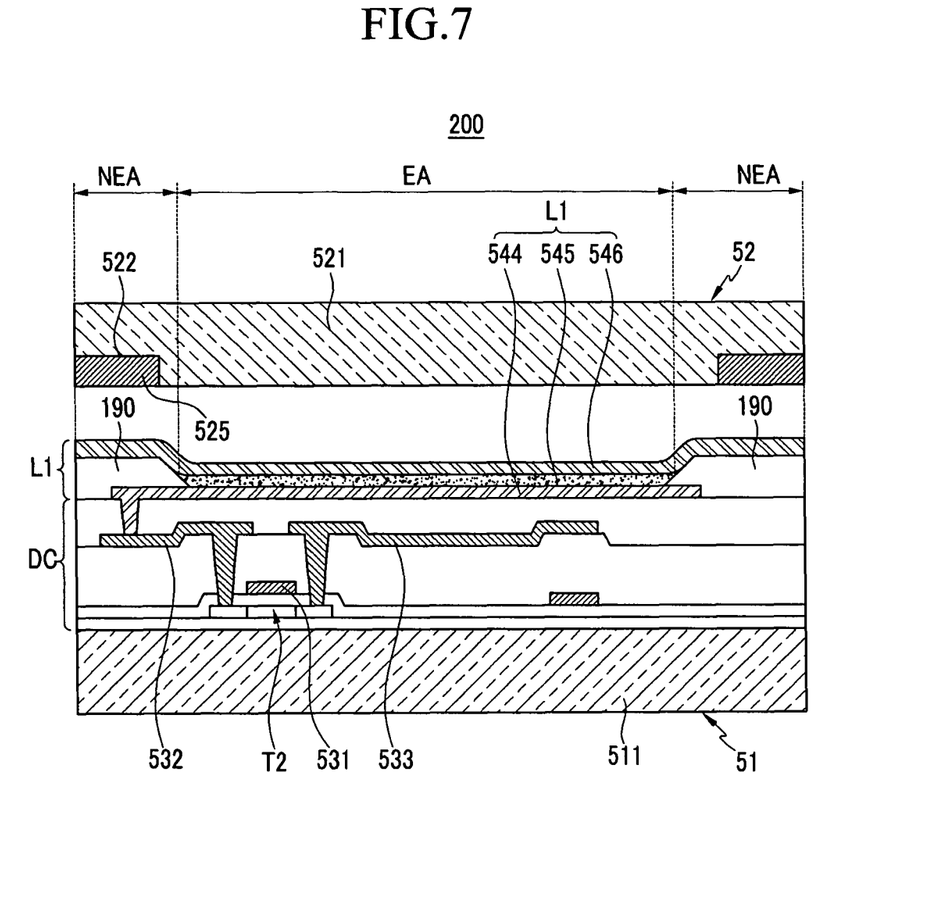
FIG. 7 illustrates a partial enlarged cross-sectional view of the OLED display of FIG. 6.

As illustrated in FIG. 6 and FIG. 7, the second substrate 52 in an OLED display 200 of the second exemplary embodiment may further include a light shield layer 525 filling the gully pattern 522.

Further, as illustrated in FIG. 6, the gully pattern 522 of the second substrate 52 may be formed on a part of the second substrate 52 corresponding to the non-light emitting region (NEA) of the organic light emitting element L1 of the first substrate 51. In detail, the gully pattern 522 of the second substrate 52 may be formed on a part of the second substrate 52 substantially corresponding to the non-opening portions of the pixel defining film 190 of the first substrate 51. Therefore, the light shield layer 525 of the second substrate 52 may also be formed on a part of the second substrate 52 corresponding to the non-light emitting region (NEA) of the organic light emitting element L1 of the first substrate 51. That is, the light shield layer 525 may substantially correspond to the non-opening portions of the pixel defining film 190 of the first substrate 51, e.g., between adjacent pixels.

The light shield layer 525 may be applied in the gully pattern 522 of the second substrate 52 by an inkjet-printing method. However, the second exemplary embodiment may not necessarily be limited thereto, and the light shield layer 525 may be formed in the gully pattern 522 of the second substrate 52 by various methods known in the art.

As described above, the light shield layer 525 may improve visual perception of the OLED display 200 by suppressing reflection of external light. In detail, the light shield layer 525 may improve the contrast of an image displayed by the OLED display 200 and may help effectively displaying a black color. The light shield layer 525 may be, e.g., an opaque material, an absorbing material, a filtering material, and so forth.

Further, it may be possible to eliminate an element, e.g., a polarizing member, commonly used to suppress reflection of external light by providing the light shield layer 525 of the second substrate 52. Therefore, it may be possible to improve luminous efficiency of the OLED display 200, which may relatively deteriorate when a polarizing member is used. That is, it is possible to increase the luminance and life-span of the OLED display 200.

Further, by using inkjet-printing, the light shield layer 525 may be formed more efficiently than using photolithography. The light shield layer 525 may be formed in the gully pattern 522 of the second substrate 52 so that the gully pattern 522 of the second substrate 52 may function as a substitute for a bank that is needed in the inkjet-printing method. Therefore, it may be possible to more effectively form the light shield layer 525 using the inkjet-printing method.

Further, since the gully pattern 522 of the second substrate 52 has a width of several micrometers ($\mu$m), the light shield layer 525 may correspondingly have a width of several micrometers ($\mu$m). The effect of suppressing external light may be reduced when the width of the light shield layer 525 is smaller than several micrometers. In contrast, when the width of the light shield layer 525 is tens of micrometers or more, the luminous efficiency of the OLED display 200 may deteriorate.

Hereinafter, an experimental example and a comparative example are described with reference to FIG. 8.

An OLED display used in an experimental example may include the gully pattern 522 formed on the second substrate 52 according to the first exemplary embodiment. An OLED display used in the comparative example may be the same as the experimental example, except for the gully pattern 522 on the second substrate 52.

Figure 8:
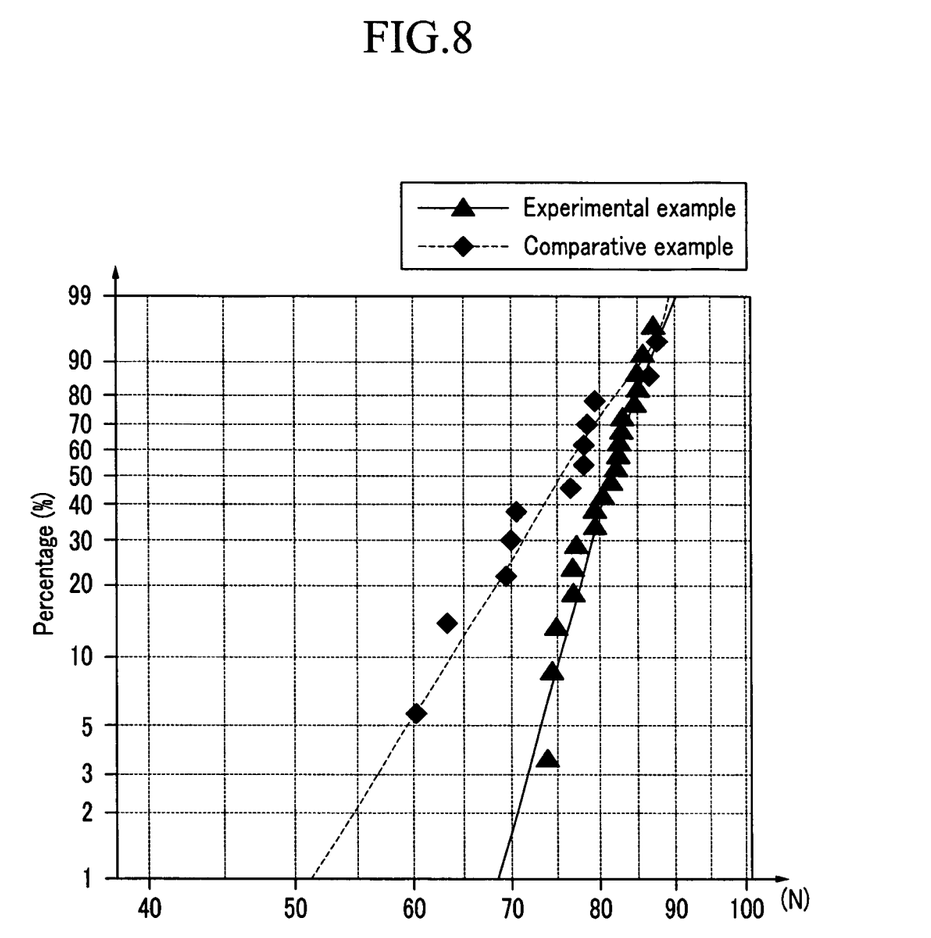
FIG. 8 illustrates a graph of an experimental example and a comparative example.

FIG. 8 illustrates a graph of average failure load measured for the both OLED displays by applying various loads of force to both experimental and comparative examples. The experiment may proceed by bending tests measured at four points of the OLED displays. As illustrated in FIG. 8, the experimental example showed an average failure load of about 81 N, while the comparative example showed an average failure load of about 75 N. In these experiments, it can be seen that the OLED display according to first exemplary embodiment may have improved mechanical strength.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a first substrate including a plurality of pixels, each pixel including at least one thin film transistor and an organic light emitting element, the organic light emitting element of each pixel including a light emitting region and a non-light emitting region; and
    a second substrate facing the first substrate and having a gully pattern recessed on a surface facing the first substrate, the gully pattern including a plurality of grooves arranged on the second substrate, the plurality of grooves being between individual pixels to correspond to non-light emitting regions of the pixels.

2. The OLED display as claimed in claim 1, wherein the grooves of the gully pattern have a stripe shape.

3. The OLED display as claimed in claim 1, wherein the grooves of the gully pattern cross each other to form a lattice shape.

4. The OLED display as claimed in claim 1, wherein, with respect to each pixel:
    the organic light emitting element includes a first electrode, an organic emission layer, a second electrode, and a pixel defining film, the pixel defining film has an opening that exposes the first electrode of the organic light emitting element and further defines the light emitting region and a non-opening portions defining the non-light emitting region of the organic light emitting element, and the gully pattern is formed at a position substantially corresponding to the non-opening portions of the pixel defining film of the pixels of the first substrate.

5. The OLED display as claimed in claim 4, wherein the non-light emitting region of the organic light emitting element of each pixel is a region of each pixel where only the second electrode is formed.

6. The OLED display as claimed in claim 4, wherein the non-light emitting region of the organic light emitting element of each pixel is a region of each pixel where the organic emissive layer does not emit light.

7. The OLED display as claimed in claim 1, wherein the gully pattern has a width of several micrometers (μm).

8. The OLED display as claimed in claim 1,
wherein the second substrate further includes a light shield layer filling the gully pattern.

9. The OLED display as claimed in claim 8, wherein the light shield layer is an inkjet-printed layer.

10. The OLED display as claimed in claim 8, wherein the light shield layer has a width of several micrometers (μm).

11. The OLED display as claimed in claim 8, wherein the light shield layer is formed on a part of the second substrate corresponding to a non-light emitting region of the organic light emitting element.

12. The OLED display as claimed in claim 8, wherein the light shield layer is formed of an opaque material, an absorbing material, or a filtering material.

13. The OLED display as claimed in claim 8, wherein the light shield layer completely fills the gully pattern.

14. The OLED display as claimed in claim 8, wherein the organic light emitting element is divided into a light emitting region and a non-light emitting region, and the gully pattern corresponds to the non-light emitting region of the organic light emitting element.

* * * * *